United States Patent [19]

Scifres et al.

[11] 4,371,966
[45] Feb. 1, 1983

[54] HETEROSTRUCTURE LASERS WITH COMBINATION ACTIVE STRIP AND PASSIVE WAVEGUIDE STRIP

[75] Inventors: Donald R. Scifres, Los Altos; William Streifer, Palo Alto; Robert D. Burnham, Los Altos Hills, all of Calif.

[73] Assignee: Xerox Corporation, Stamford, Conn.

[21] Appl. No.: 204,430

[22] Filed: Nov. 6, 1980

[51] Int. Cl.$^3$ .............................................. H01S 3/19
[52] U.S. Cl. ........................................ 372/45; 357/17; 372/46
[58] Field of Search .................... 331/94.5 H; 357/17, 357/18; 357/17; 372/45, 46, 48

[56] References Cited
U.S. PATENT DOCUMENTS

| 4,270,096 | 5/1981 | Hayashi et al. | 331/94.5 H |
| 4,282,494 | 8/1981 | Yonezu et al. | 331/94.5 H |
| 4,297,652 | 10/1981 | Hayashi et al. | 331/94.5 H |
| 4,321,556 | 3/1982 | Sakuma | 372/48 |

Primary Examiner—James W. Davie
Attorney, Agent, or Firm—W. Douglas Carothers, Jr.

[57] ABSTRACT

Heterostructure injection lasers include a combination optically coupled active and passive waveguide means forming an optically confining channel or strip between end facets. A passive or transparent waveguide means in the vicinity of the laser facets optically confines the radiation thereto in both dimensions transverse to the direction of propagation. The passive means is coupled to an active region of the laser which also optically confines the propagating radiation to the active region in both dimensions transverse to the direction of propagation. The active strip does not extend to the end facets of the laser. The combination active and passive means provides for high power, low divergence output beam, fundamental transverse mode control, lower operational current thresholds and the substantial elimination of laser astigmatism found in strip buried heterostructure lasers.

8 Claims, 18 Drawing Figures

HETEROSTRUCTURE LASERS WITH COMBINATION ACTIVE STRIP AND PASSIVE WAVEGUIDE STRIP

This invention relates to semiconductor heterostructure injection lasers.

Since the introduction of the heterostructure laser, this structure has come into much prominance with many geometric variations.

One of the most important variations has been the buried heterostructure laser wherein the active layer or region is partially or completely surrounded with material of higher bandgap and lower index of refraction.

Over the last several years, much attention has been given to provide fundamental transverse mode control and low beam divergence in buried heterostructure lasers. An early idea was to provide the end of an injection laser with a transparent umpumped region having a passive waveguide core coupled to the active layer, as shown in U.S. Pat. No. 3,790,902.

More recently, the suggestion has been to provide an active region or strip such as, GaAs, completely surrounded by a higher index of refraction material, such as, GaAlAs. Examples of such heterostructures are found in U.S. Pat. Nos. 4,121,177, 4,176,325 and 4,190,813 and in the paper of W. F. Tsang et al. entitled, "GaAs-Al$_x$Ga$_{1-x}$As Buried Heterostructure Lasers Grown by Molecular Beam Epitaxy ..." *Applied Physics Letters*, Vol. 36, No. 9, pp 730-735, May 1, 1980 and have been referred to as strip buried heterostructure lasers because the active layer geometry is in the form of a three dimensional strip and waveguide. Such a strip is desirable because of its preferred mode selection and optical guiding capability.

Even more recently, the suggestion has been made to provide an optically transparent unpumped region at the end mirror facets to reduce mirror degradation. This concept is disclosed in the paper of H. O. Yonezu et al. entitled "An AlGaAs Window Structure Laser," IEEE *Journal of Quantum Electronics*, Vol. QE-15, No. 8, pp 775-781, August, 1979. This concept has been suggested for integration into the strip buried heterostructure laser [R. L. Hartman et al., "The CW Electro-Optical Properties of (AlGa)As Modified-Strip Buried Heterostructure Lasers, " *Journal of Applied Physcis*, Vol. 51, No. 4, pp 1909-1918, April 1980].

A fundamental aspect of these laser structures is that, although there is optical confinement and waveguiding in the transparent or window end structures in the dimension perpendicular to the plane of the p-n junction, there is no optical confinement along the plane of the p-n junction. This leads to laser astigmatism, which is a fundamental problem of these prior art laser structures. Because there is no waveguiding in the dimension parallel to the plane of the p-n junction, the propagating radiation is emerging from two spatially separate apertures, one located internally at the ends of the buried active region and the other located at the facets of the laser. This phenomenon produces laser astigmatism, i.e., the inability to focus sharply on a single plane without correcting optics. Because of this, more than one lens is needed to focus the radiation emitted from a facet. This would require an expensive arrangement rendering these types of lasers not too practical for application requiring beam focusing, such as, optical disk recording and playback.

Furthermore, these buried heterostructure lasers are difficult to fabricate. A second stage growth is necessary. The strip active region is formed by a preferential etch process after growth of the laser structure has been completed to the two dimensional active layer. After formation of active strip region, the second stage growth is commenced. Difficulties are encountered because nonuniform wetting of the second stage GaAlAs occurs. As a result, nonuniform growth occurs on the last grown, first stage GaAlAs layer.

Prior to second stage growth, one must etch a portion of the last grown, first stage GaAlAs layer to obtain some uniformity in wetting during second stage GaAlAs growth. However, there is no way of telling if the etch back performed is uniform over the entire etched surface.

SUMMARY OF THE INVENTION

According to this invention, two principal improvements are provided over the prior art strip buried heterostructure lasers.

A first and major improvement is the provision of a passive or transparent waveguide strip means in the vicinity of the laser facets which optically confines the radiation in the strip means in both dimensions transverse to the direction of propagation. The passive strip means is coupled to an active region of the laser which also optically confines the propagating radiation and does not extend to the end facets of the injection laser. This combination of an optically confining passive waveguide strip means and an optically confining active region allows for higher output powers, low beam divergence, fundamental transverse mode control, lower operational current thresholds of as much as 20% to 30% and substantially eliminates laser astigmatism.

A second improvement is the formation of a combination, optically confined and optically coupled active and passive strip means by etching back into the substrate to provide improved wetting quality and obtain uniform growth starting from the laser substrate during second stage growth.

The heterostructure laser according to one embodiment of this invention comprises a plurality of contiguous semiconductor layers epitaxially deposited on a semiconductor substrate. One of these layers is an active layer and has a lower bandgap and higher index of refraction than at least the immediately adjacent cladding layers to the active layer to permit carrier recombination and support radiation propagation between transverse end facets of the laser under lasing conditions.

The optically confining nature of the active and passive strip may be achieved in different ways. The formation may be by material compositional, doping or thickness differences within regions or adjacent to regions in which the radiation propagates. For example, this may be accomplished by forming preferentially diffused regions or by forming a combination of preferentially diffused regions and nonplanar regions. Alternatively, these compositional, doping and/or thickness variations may be accomplished by diffusion, chemical etching, preferential crystal growth, ion milling or ion implantation.

In the case of compositional differences, the active strip may be encompassed by lower refractive index and higher badngap material. The passive waveguide strip may comprise a butt coupled extension from the active strip to the end facet or an adjacent, contiguous strip extending between end facets and tapered coupled to the active strip. In either case, the passive strip is optically confined, i.e., is encompassed with lower refractive index and higher bandgap material causing optical confinement, except relative to the active strip material. In the case of butt coupled extensions, the extensions may be formed, during epitaxial growth, with material compositional differences from the active strip or may be of the same compositional differences but comprising different doping and conductivity type as compared to the active strip. The active strip formed of doping differences is created by preferential diffusion techniques.

The passive waveguide strip means may also comprise a nonplanar waveguide layer with an enlarged thick region which is a waveguide component of the laser optical cavity. The cavity would be optically equivalent to an optical cavity comprised of material compositional differences mentioned in the previous paragraph.

At least a portion of the propagating radiation developed in the active strip penetrates and couples into the passive waveguide strip means and is optically confined to the strip means between the active strip and the end facets.

Other objects and attainments together with a fuller understanding of the invention will become apparent and appreciated by referring to the following description and claims taken in conjunction with the accompanying drawings. Sectional views are not cross hatched in order to aid perceptual understanding of the laser structures as described.

DETAILED DESCRIPTION

Figure 1:
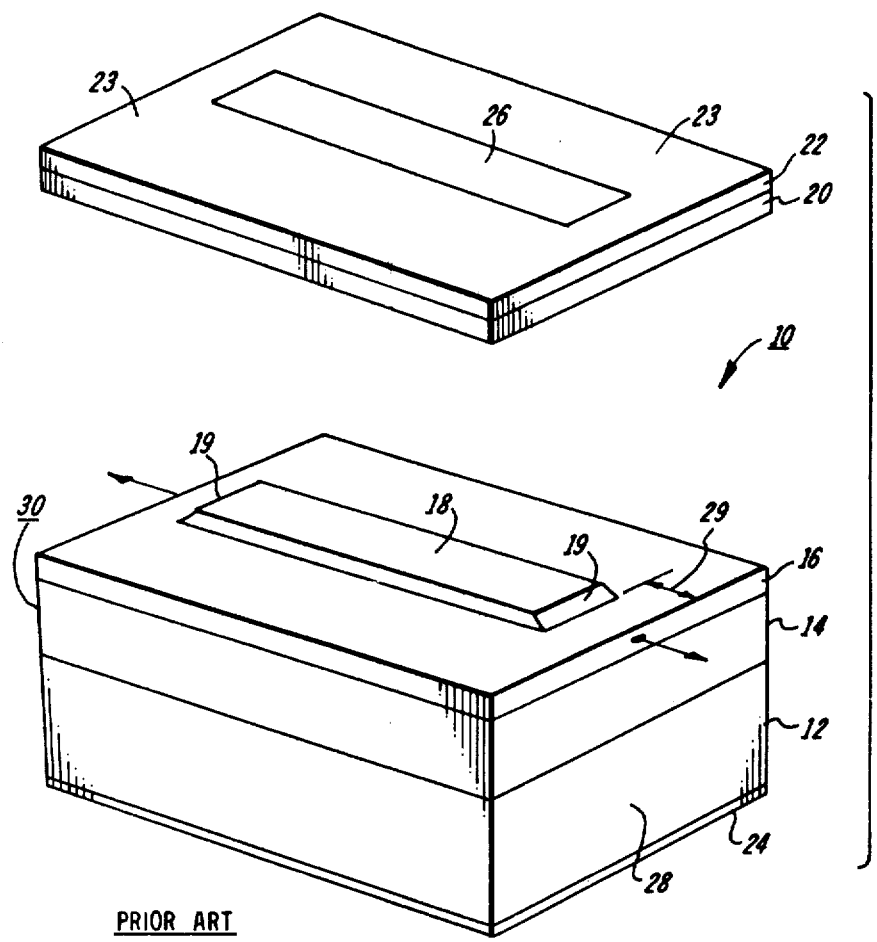
FIG. 1 is a schematic exploded isometric prior art buried heterostructure laser having a passive waveguide layer.

In FIG. 1, buried heterostructure laser 10 is similar to the strip buried heterostructures recently known in the art except that the narrow active region or strip 18 does not extend to the cleaved mirror facets 28 and 30. Laser 10 comprises a plurality of semiconductor layers, for example, of GaAs and GaAlAs of varying doping levels, thicknesses and composition. Substrate 12 may be n-GaAs. Layers 14 and 20 may be n-$Ga_{0.7}Al_{0.3}As$ and p-$Ga_{0.7}Al_{0.3}As$, respectively. The buried active region or strip 18 is either n-type or p-type GaAs or may have a light aluminum content, such as, $Ga_{0.95}Al_{0.05}As$. The passive waveguide layer may be n-$Ga_{0.8}Al_{0.2}As$.

Contact layer 22 may be p-GaAs and proton implanted in region 23 to provide a high resistive region and create means for current confinement in the form of a stripe 26, as is known in the art.

A metallic contact 24 is deposited on the bottom surface of laser 10.

The active strip may be about 5 to 10 $\mu$m wide and extend to within 50 to 100 $\mu$m of the cleaved facts 28 and 30. The active strip 18 is optically coupled to passive waveguide layer 16 by tapered couplers 19.

The active strip 18 with its tapered end couplers 19 may be formed after first stage growth employing liquid phase epitaxy (LPE), metalorganic chemical vapor deposition (MO-CVD) or molecular beam epitaxy (MBE). The growth process is completed up to and including an active layer. At this point, the active layer is selectively etched away, via preferential masking, to create the active layer strip 18. The second stage growth of layers 20 and 22 may then be accomplished by liquid phase epitaxy (LPE), MO-CVD or MBE. If the second stage growth is performed by LPE, the aluminum content of layer 16 should be changed in order to facilitate growth and no aluminum should be included in the active region 18. For example, waveguide layer 16 may be n-$Ga_{0.9}Al_{0.1}As$ (low aluminum content) and the active strip 18 either n- or p- GaAs. This is because GaAlAs resists wetting during LPE growth. U.S. Pat. No. 4,190,813 proposes an alternative to this problem of wetting and subsequent LPE growth on aluminum containing Group III-V compounds by leaving a very thin p-GaAs active layer of 200Å thick during preferential etching so that the aluminum containing layer 20 will wet and uniformly grow during second stage LPE growth. It is difficult, however, to control the etching process to leave a uniform GaAs layer of such thin cross-sectional thickness.

In any regard, these etching and wetting difficulties can be eliminated by employing the two stage fabrication in accordance with this invention.

A desired feature in laser 10 is that the coupling of propagating radiation into the passive waveguide layer 16 provides low mirror degradation at the facets 28 and 30, since these regions are not being actively pumped and carrier recombination is not occurring there. Since no recombination occurs in these regions, there is no need for protective facet coatings and the lifetime of the laser is greatly enhanced.

Laser 10 with the active strip 18 provides for good lateral waveguiding, as do the strip buried heterostructures of the prior art. However, lateral waveguiding in the end regions 29 is lost since the propagating wave can spread out into the two dimensional transparent waveguide layer 16. Furthermore, this structure leads to astigmatism of the laser beam. Two spatially separate radiation apertures are formed in wavegide layer 16 at end region 29 by this structural geometry, one being at the position of couplers 19 and the other at the end facets 28 and 30. Furthermore, controlling the length of the region 29 between the tapered coupler 19 and the end facets 28 and 30 is difficult to precisely fabricate. The degree of laser astigmatism is difficult to control.

However, these difficulties can be eliminated in accordance with this invention.

Laser 30, shown in FIGS. 2 to 6, curcumvents the mentioned difficulties. Laser 30 is fabricated by a two stage growth process. The portion of the laser structure produced during first stage growth is designated 30.1 and the portion of the structure produced during second stage growth is designated 30.2

Structure 30.1 comprises multiple semiconductor layers epitaxially deposited on substrate 32. Substrate 32 may be, for example, n-GaAs. Cladding strips 34, transparent or passive waveguide strip 36, active strip 38, cladding strip 40 and contact strip 42 (all initially formed epitaxial deposited layers subsequently created into mesa 33 by preferential etching) may respectively comprise, n-Ga$_{1-d}$Al$_d$As, nGa$_{1-c}$Al$_c$As, n- or p-Ga$_{1-b}$Al$_b$As, p-Ga$_{1-a}$Al$_a$As and p$^+$-GaAs, where a, d>c>b.

Structure 30.2 comprises multiple semiconductor layers 44, 46 and 48 epitaxially deposited on the substrate 32 with the then completed mesa structure 33 being masked. Layers 44, 46 and 48 may, respectively, comprise p-Ga$_{1-x}$Al$_x$As, n-Ga$_{1-y}$Al$_y$As and n-GaAs where x, y>a, d. These confining layers may also be Ge or O doped to provide for high resistance. This doping of these layers will provide for current confinement to the mesa structure 33. Other means of current confinement may be employed, such as, oxide strips or proton implantmant.

Examples of ranges of layer thickness and composition for laser 30 are illustrated in Table I.

| Layer | Composition | Thickness (μm) |
|-------|-------------|----------------|
| 34 | d = 0.2–0.5 | 1–3 |
| 36 | c = 0.1–0.2 | t = 0.2–2 |
| 38 | b = 0.0–0.2 | 0.05–1 |
| 40 | a = 0.2–0.5 | 1–3 |
| 44 | x = 0.2–0.4* | ** |
| 46 | y = 0.2–0.4* | ** |

*may be up to 0.65 with Ge or O doping
**not critical except as to relative height along mesa structure 33

The width, W, of mesa 33 may be in the range of about 2–20 μm.

An alternative approach for fabricating the structure 30.2 would be to epitaxially grow a single p-Ga$_{1-x}$Al$_x$As layer 44 equal in thickness to combined layers 44, 46 and 48. This layer may be Ge or O doped to provide high resistance.

Laser 30 is completed with a metal contact 50 deposited on strip 42 and metalization 52 deposited on the bottom surface of substrate 32. Upon forward biasing of laser 30, via contacts 50 and 52, recombination of carriers will occur in the plane of the p-n junction at active strip 38. Radiation propagation will couple at coupling regions 39 of active stripe 38 into the waveguide strip 36 with optical feedback and output occurring at end facets 54 and 56 and with laser emission at region 58.

The output beam can be made substantially symmetric by making the dimensions W and t about equal. Because the radiation is guided in both the lateral and vertical planes of the laser, the beam waist will occur only at the end facet so that there is no substantial astigmatism.

A further advantage of the structure of laser 30 is the reduction in laser threshold owing to the optically confined transverse dimensional waveguiding in the direction of radiation propagation to the laser end facets. No recombination of carriers will occur at the facets 54 and 56 and there will be good lateral waveguiding along the active strip 38. The radiation propagation will be confined to the passive and active strips 36 and 38 and the current will be substantially confined to the mesa structure 33. The fundamental transverse mode propagation can be optimized because higher order modes have a larger beam spread and will not be able to geometrically propagate in the confines of the active and passive strips 36 and 38 and will radiate into adjacent lower index and higher bandgap material.

Figure 7:
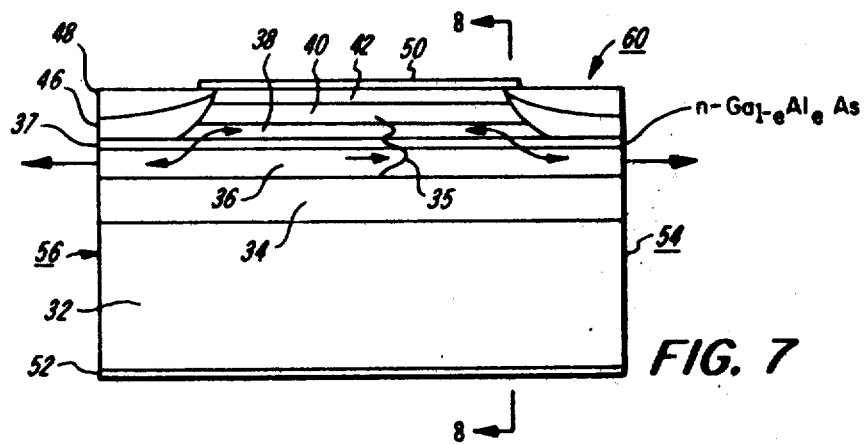
FIG. 7 is a side sectional view of a buried heterostructure laser in accordance with another embodiment of this invention and includes a very thin high bandgap strip between the active and passive strips of the laser.
Figure 8:
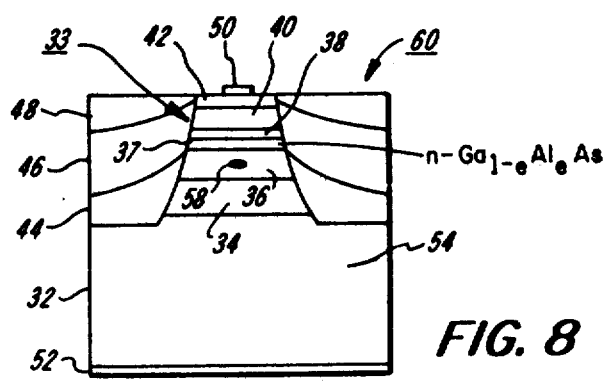
FIG. 8 is a sectional view of the laser shown in FIG. 7 as taken along the line 8—8 of that Figure.

Laser 60 disclosed in FIGS. 7 and 8 is identical to laser 30 with the addition of thin strip 37 comprising, for example, n-Ga$_{1-e}$Al$_e$As, where e>c. This strip is very thin, such as, 1000Å or less. The molar fraction, e, may be about 0.2 to 0.6. This molar fraction may be greater than the molar fraction a or d. However, this is not necessary for the proper functioning of strip 37.

Strip 37 acts as a barrier to charge carriers so that there is no charge leakage into the optical waveguide 36. However, strip 37 permits the propagating radiation to spread down into the waveguide 36, as illustrated at 35. Thus, active strip 38 and passive strip 36 form a two guide for the propagating radiation.

Figure 9:
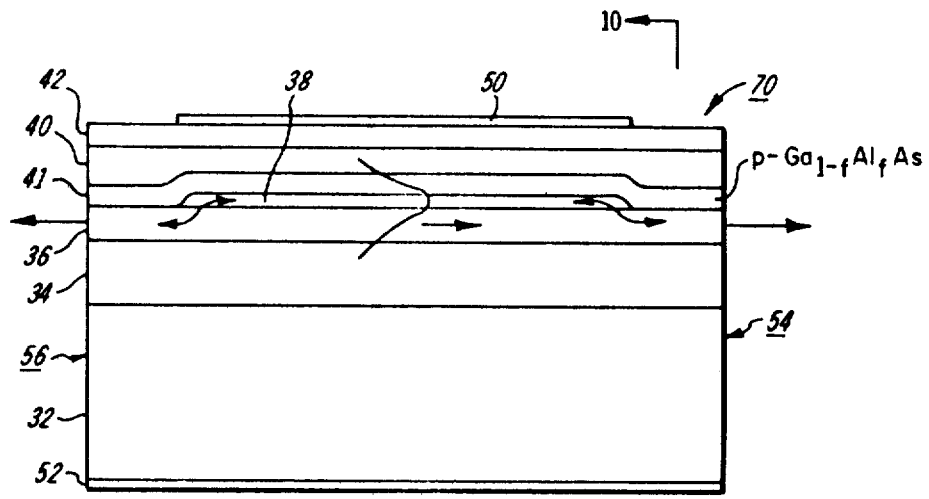
FIG. 9 is a side sectional view of a buried heterostructure laser in accordance with another embodiment of this invention and includes an additional passive waveguide strip so that radiation developed in the active strip is coupled into both passive waveguide strips.
Figure 10:
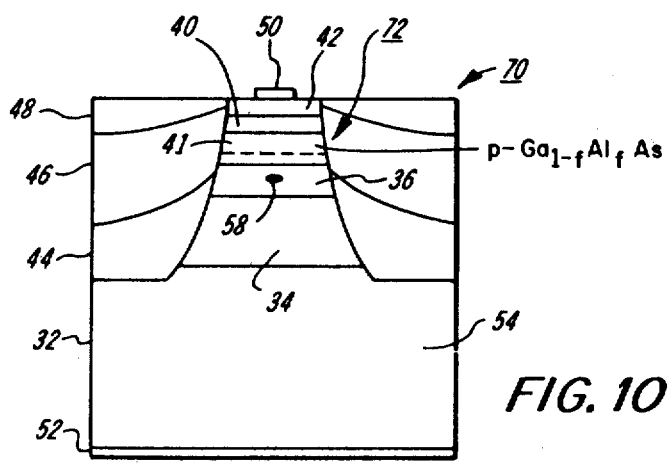
FIG. 10 is a sectional view of the laser shown in FIG. 9 along the line 10—10 of that Figure.

Laser 70 disclosed in FIGS. 9 and 10 is identical to laser 30 with the addition of passive waveguide layer 41 contiguous with the active strip 38 and the cladding layer 40. Strip 41 may, for example, comprise p-Ga$_{1-f}$Al$_f$As, where f is the same as or nearly the same as c.

The epitaxial growth procedure for laser 70 will be a little different from the procedure for lasers 30 and 60. Epitaxial growth proceeds up to and including the active layer. The active strip 38 is then selectively etched from the active layer. A second stage growth is commenced wherein initially deposited layers comprising strips 41, 40 and 42 are epitaxially deposited. With masking to form the central mesa structure 72 and preferential etching of the structural sides, etching reaches the substrate, as best illustrated in FIG. 10. Note that mesa structure 72 differs from the mesa 33 of laser 30 in that strips 41, 40 or 42 extend to the end facets 54 and 56 of laser 70. A third stage epitaxial growth (LPE, MBE or MO-CVD) is next with the masking of the top surface of mesa 72 and growth of layers 44, 46 and 48, thereby filing in the structural sides. Again, these three layers can comprise a single GaAlAs layer having high resistivity via Ge or O doping.

A confining strip, such as, strip 37 in laser 60 of FIG. 7, may be employed on each side of the active strip 38 in laser 70.

Fabrication of lasers 30, 60 and 70 may be performed in the following manner. The mesa structure is formed by standard buried heterostructure procedure as exemplified in the disclosure of T. Tsukada, *Journal of Applied Physics*, Vol. 45, at page 4899 et seq. (1974). First, growth of layers 34, 36, 38, 40 and 42 may be accomplished by LPE, MO-CVD or MBE. Using standard photolithography, delineation of the area to be etched is formed by selective masking and exposure, with preferential etching performed down to layer 36. With proper masking, a central mesa structure just comprising strips 38, 40, 42 will be formed. The tapered coupling regions 39 are formed during etching due to the type of etchant employed. This central mesa structure may also be formed by ion milling or reactive ion etching.

Figure 2:
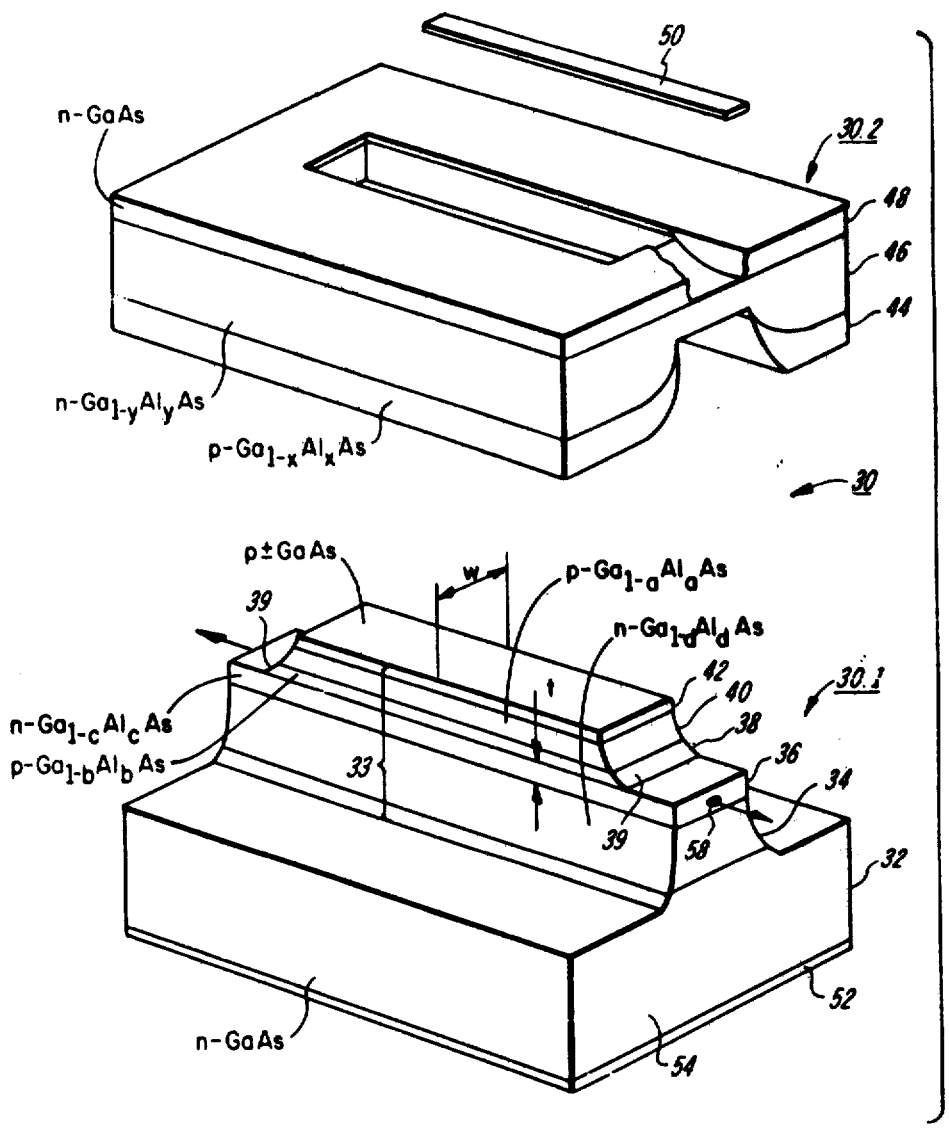
FIG. 2 is a schematic exploded isometric view of the buried heterostructure laser in accordance with one embodiment of the present invention.
Figure 3:
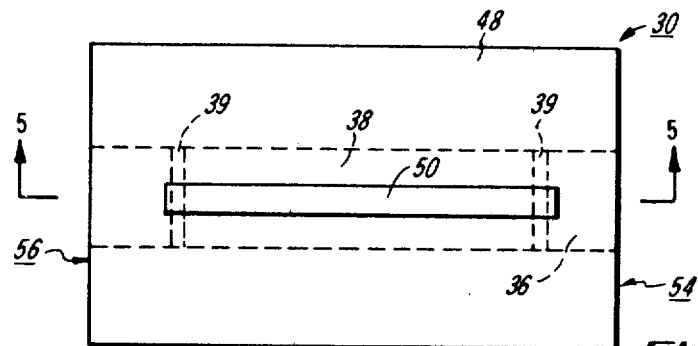
FIG. 3 is a plan view of the laser shown in FIG. 2.
Figure 4:
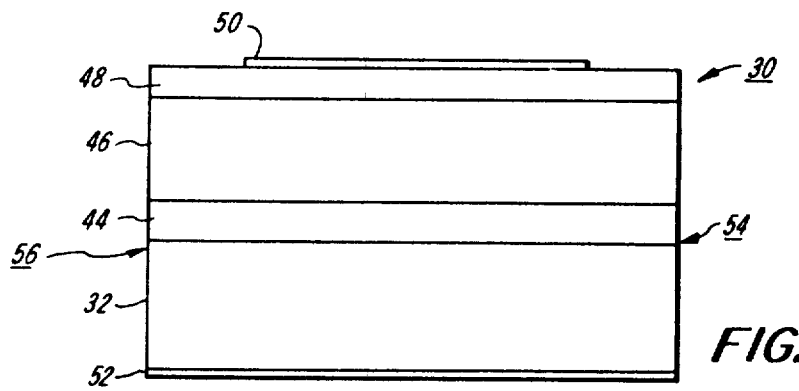
FIG. 4 is a side elevation of the laser shown in FIG. 2.
Figure 5:
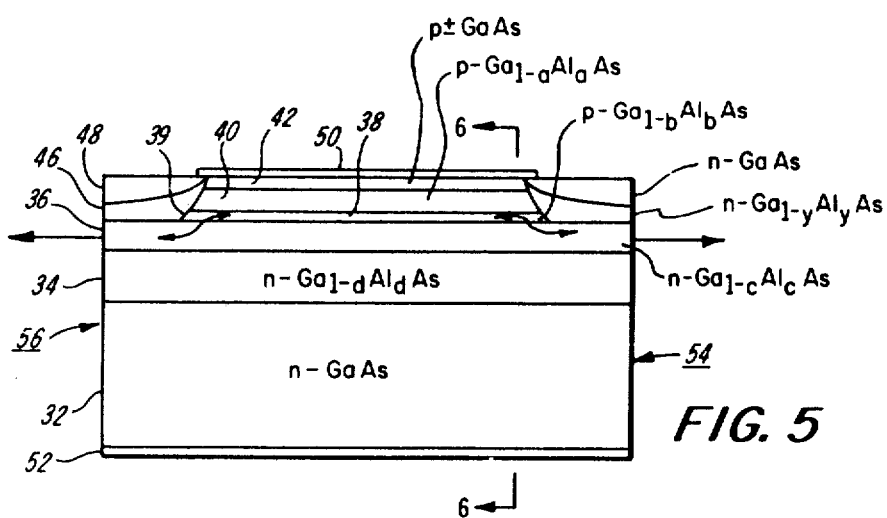
FIG. 5 is a side sectional view of the laser shown in FIG. 2 along the line 5—5 of FIG. 3.
Figure 6:
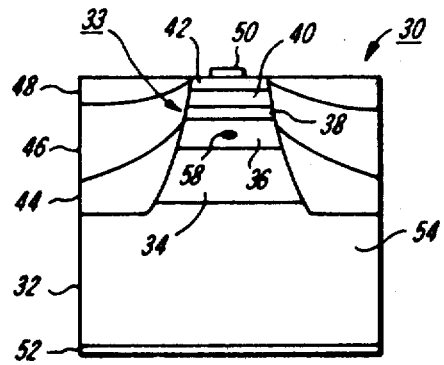
FIG. 6 is a sectional view of the laser shown in FIG. 2 along the line 6—6 of FIG. 5.

A second etching procedure then follows this first etching procedure. This second procedure consists of applying photoresist on the elongated partially formed mesa structure to protect the mesa structure and its formed end extents. The second etching is applied to the side structure adjacent to the partially formed mesa structure. The etching proceeds down into the substrate 32 as indicated in FIG. 2. The mesa 33 and structure 30.1 has, at this stage, been completely formed.

If growth techniques, for example, MO-CVD or MBE, are used for the second stage growth rather than LPE, etching beyond the active region without continuing to or into the substrate may suffice.

The laser device is now completed with second stage growth by employing either LPE, MO-CVD or MBE. This growth comprises layers 44, 46 and 48 (structure 30.2).

An alternative procedure would be to eliminate the first stage etching and grow layers 34 to 42 with formation of the active strip 38 in situ by masking techniques that may be employed in either MO-CVD or MBE. The only etching is the previous explained second stage etching. This preferential etching step proceeds down into the substrate followed by the previously explained second stage growth of layers 44, 46 and 48.

The fabrication of laser 70 in FIG. 9 is according to this alternative procedure since the active strip 38 is formed on the deposited layer including strip 36 and subsequently deposited layers 41, 40 and 42 extend to end facets 54 and 56.

Alternative optically transparent end structures may be designed to be an optical equivalent to the passive waveguide strips of the previous figures. These alternative structures as disclosed in FIGS. 11–18.

Figure 11:
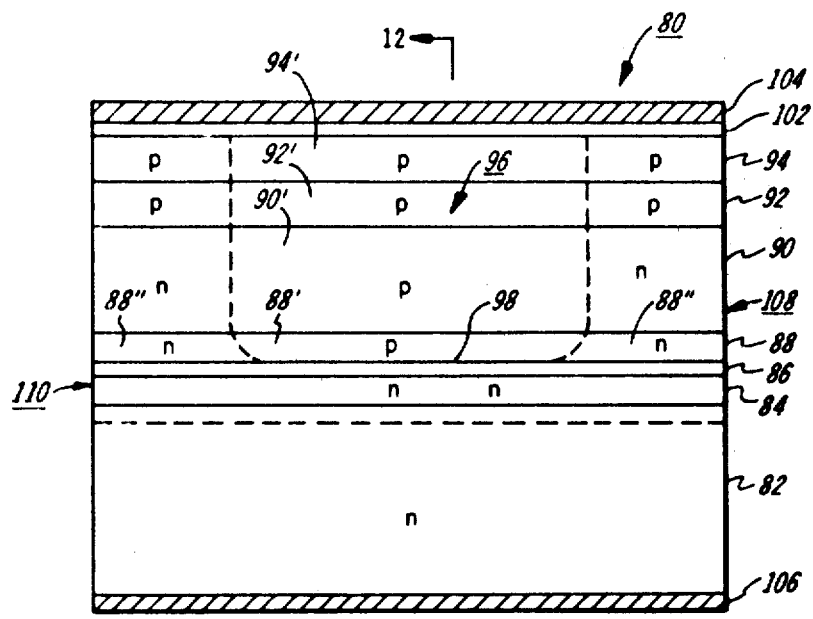
FIG. 11 is a side sectional view of a heterostructure laser in accordance with another embodiment of this invention and includes a diffusion region and an additional waveguide region which functions as a waveguide strip.
Figure 12:
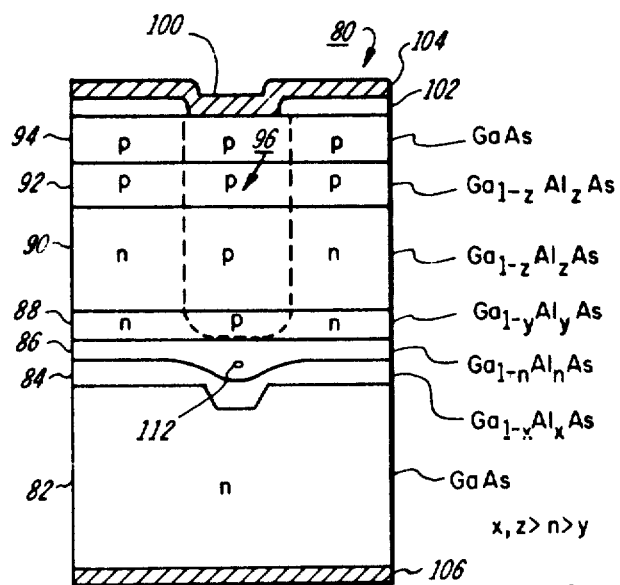
FIG. 12 is a sectional view of the laser shown in FIG. 11 along the line 12—12 of that Figure.

In FIGS. 11 and 12, laser 80 comprises a channel substrate layer comprising substrate 82, cladding layer 84 (n-$Ga_{1-x}Al_xAs$), nonplanar passive waveguide layer 86 (n-$Ga_{1-n}Al_nAs$), active layer 88 (n-$Ga1-yAl_yAS$), cladding layer 90 (n-$Ga_{1-z}Al_zAs$), second cladding layer 92 (p-$Ga_{1-z}Al_zAs$) and contact layer 94 (p-GaAs).

A p-type preferential diffusion region 96 is formed into the central region of laser 80 to the interface of layers 86 and 88 forming slightly higher conductive bulk regions 92' and 94' in p-type layers 92 and 94 and p-type bulk regions 88' and 90' in layers 88 and 90. A p-n junction 98 is thus formed at the active layer 88.

Contact and current confinement is provided by the diffusion region 96 and contact stripe 100. Stripe 100 comprises the oxide strips 102 and metalization 104 as is well known in the art. The bottom contact for laser 80 is provided by metalization 106.

The diffusion forms a p-n junction in a lower bandgap junction 98 compared to the higher bandgap p-n junction formed between layers 90 and 92. Carrier recombination occurs at junction 98 at current thresholds well below any possible turn-on threshold of the higher bandgap p-n junctions remaining between layers 90 and 92. Thus, these latter junctions are effective in blocking the passage of current through these end regions so that current flow near the end facets 93 and 95 is substantially prevented.

Carrier recombination occurs at p-n junction 98 in strip region 88' upon forward biasing of laser 80 and radiation propagation between end facets 108 and 110 in layers 86 and 88. No carrier recombination occurs in regions 88'' of layer 88. A portion of the radiation propagation in the active strip region 88' and will couple into enlarged region 112 of waveguide layer 86. The taper of layer 86 and its enlarged region 112 and active regions 88'' function together to couple propagating radiation in an "invisible strip" between the end facets 93 and 95. Because of the nonplanar thicker region 112 in layer 86, the propagating radiation favors this region for propagation in layers 86 and 88. This region functions in the same manner as strip 36 in laser 30, i.e. region 112 is optically equivalent to strip 36. Thus, laser 80 provides a non-absorbing region at the facets and eliminates laser astigmatism in the same manner as laser 30 in FIG. 2.

Figure 13:
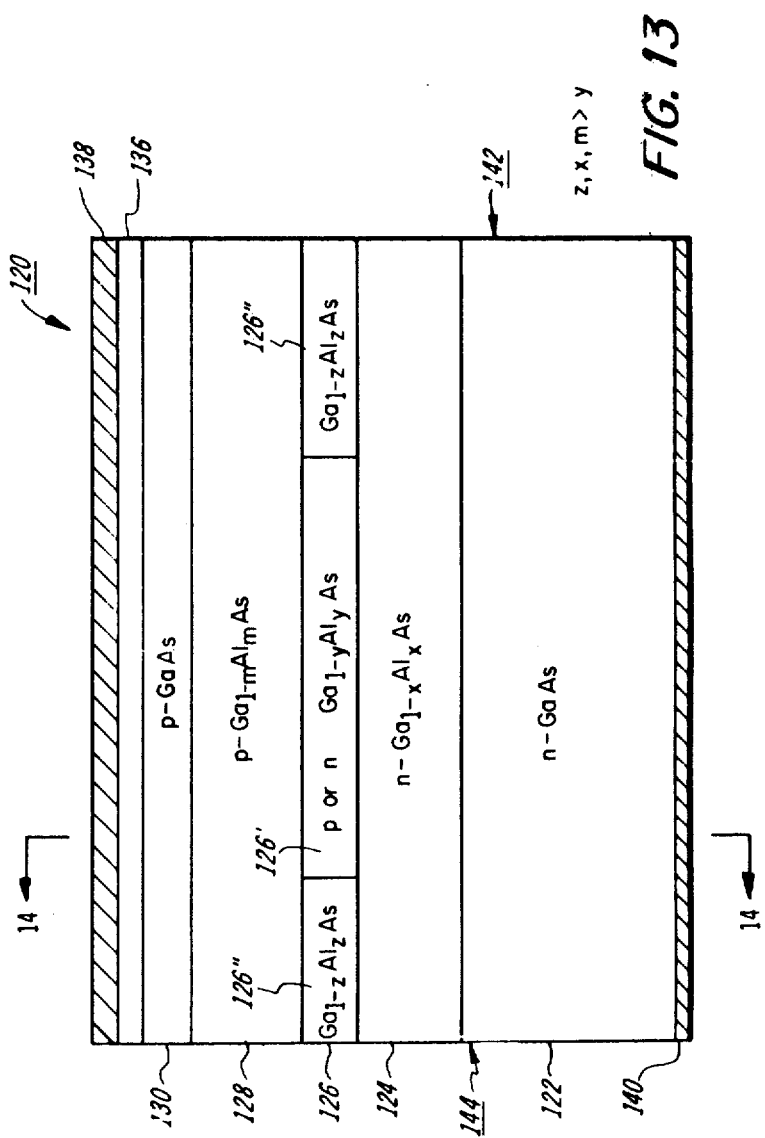
FIG. 13 is a side sectional view of a heterostructure laser in accordance with another embodiment of this invention and includes a differentially grown active strip.
Figure 14:
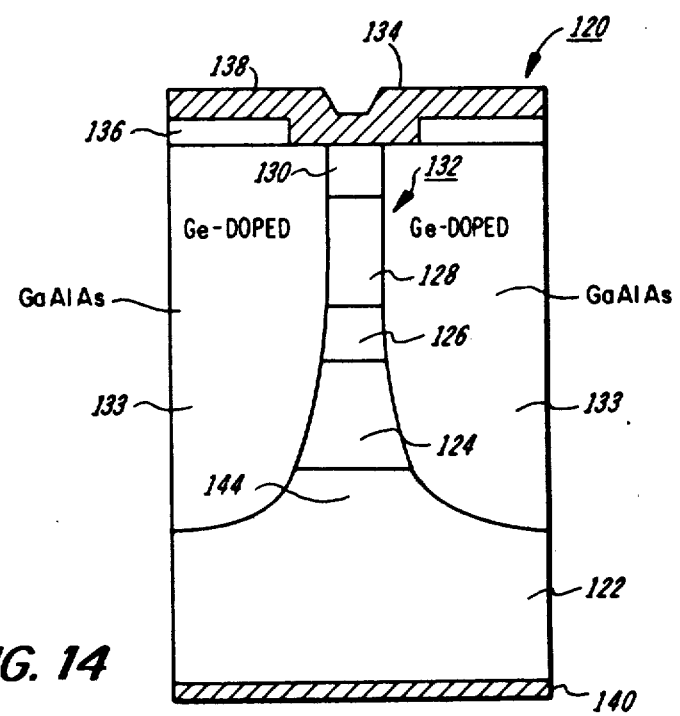
FIG. 14 is a sectional view of the laser shown in FIG. 13 along the line 14—14 of that Figure.
Figure 15:
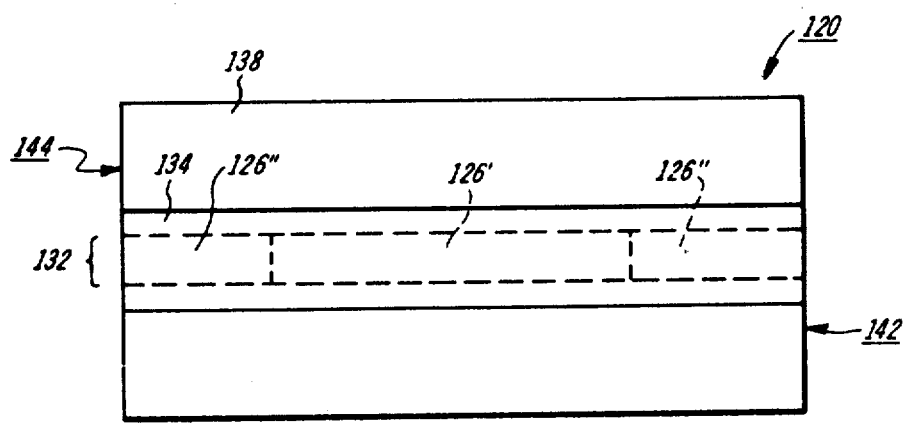
FIG. 15 is a plan view of the laser shown in FIG. 13.

In FIGS. 13–15, laser 120 comprises a substrate 122, cladding strip 124, active strip 126, cladding strip 128 and contact strip 130.

Active strip 126 comprises active strip 126' of p or n doped $Ga_{1-y}Al_yAs$ and juxtaposed passive waveguide strips 126'' of $Ga_{1-z}Al_zAs$, where z is slightly greater than y but preferably not as large as m or x. Laser 120 is best suited for fabrication by MBE due to composite nature of strip 126. First, a layer inclusive of strip 124 of n-$Ga_{1-x}Al_xAs$ is deposited on a n-GaAs substrate 122. A layer inclusive of strip 126 is next formed by employing a fixed and/or rotating mask structure between the elemental sources of Ga, Al, As and the elemental dopant in the MBE vacuum chamber. The properly positioned masking will block the dopant from depositing in regions 126'' while permitting a greater epitaxial deposition of Al than Ga in those same regions. These masking techniques are disclosed in the art.

The epitaxial deposition is completed with the deposition of the layers of p-$Ga_{1-m}Al_mAs$ and p-GaAs.

After these layers are epitaxially formed, a side preferential etch into substrate 122 is performed, as best shown in FIG. 14. This forms the central mesa 132 from facet to facet comprising the strips 124–130. A second stage epitaxial growth, with the mesa top surface masked, comprises Ge doped GaAlAs regions 133, to provide current confinement to mesa 132. The current connection to mesa 132 is formed in a conventional manner by the contact stripe 134 comprising the oxide strips 136 and metalization 138. The bottom contact is provided by metalization 140.

Laser 120 differs from previous laser structures in that there is no transparent or passive waveguide strip tapered coupled to the buried active strip. Rather, the strips 126'' are butt coupled to the active strip 126'. The end result achieved is the same, in that the radiation created in the active strip propagates and couples into a passive waveguide strip which carries the propagation to the end facets 142 and 144 for feedback and emission from the facets. In either case, the propagating beam waist will occur only at the facets 142 and 144, thereby providing fundamental mode control, substantially eliminating laser astigmation and permitting lower operational thresholds.

Figure 16:
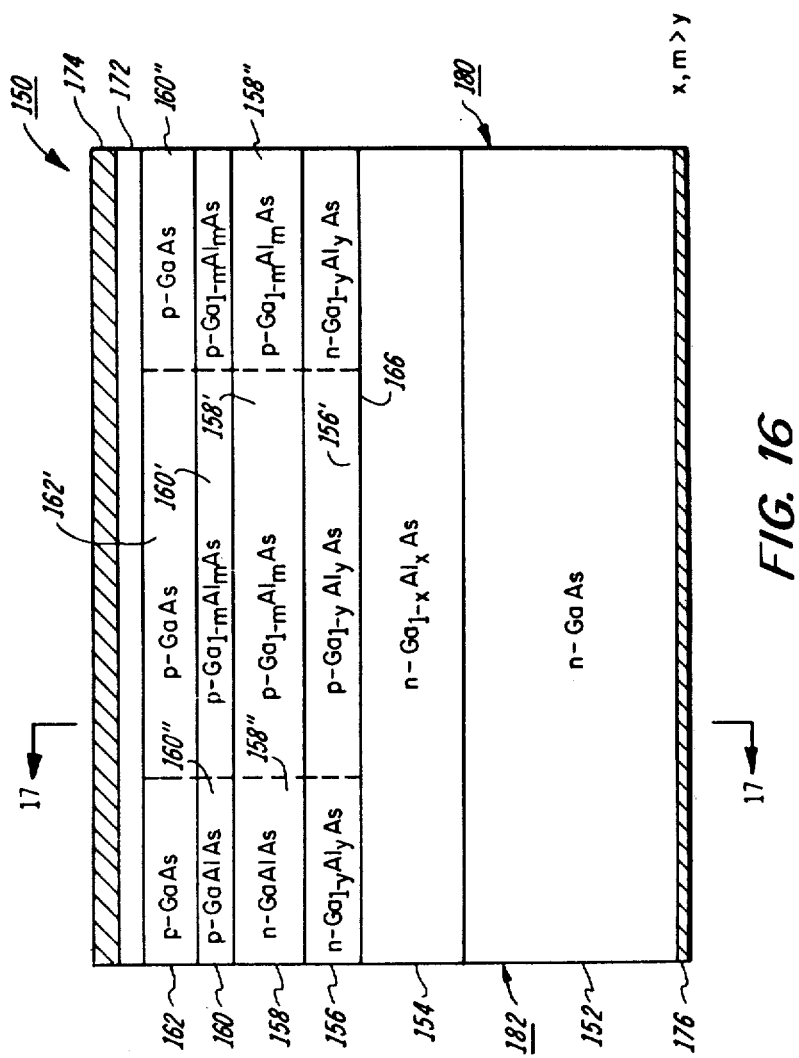
FIG. 16 is a side sectional view of a heterostructure laser in accordance with another embodiment of this invention and includes a central diffusion region.
Figure 17:
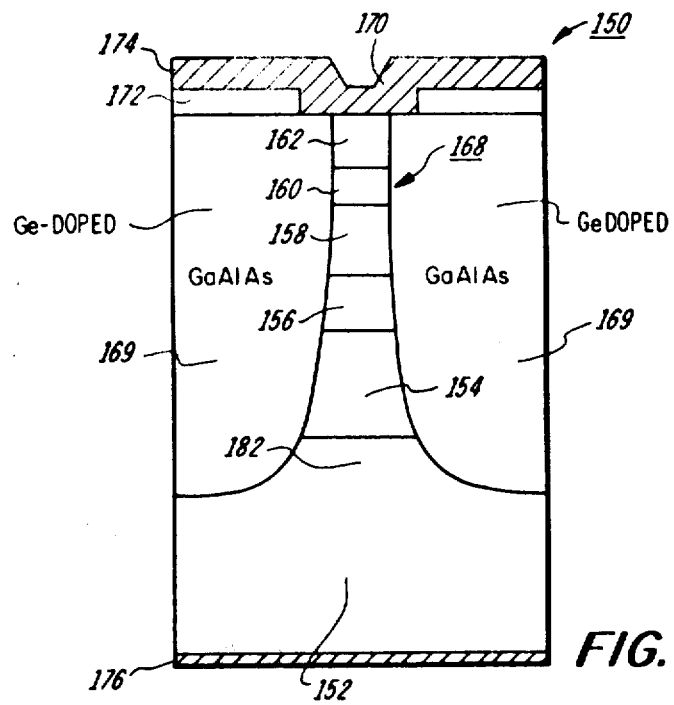
FIG. 17 is a sectional view of the laser shown in FIG. 16 taken along the line 17—17 of that Figure.
Figure 18:
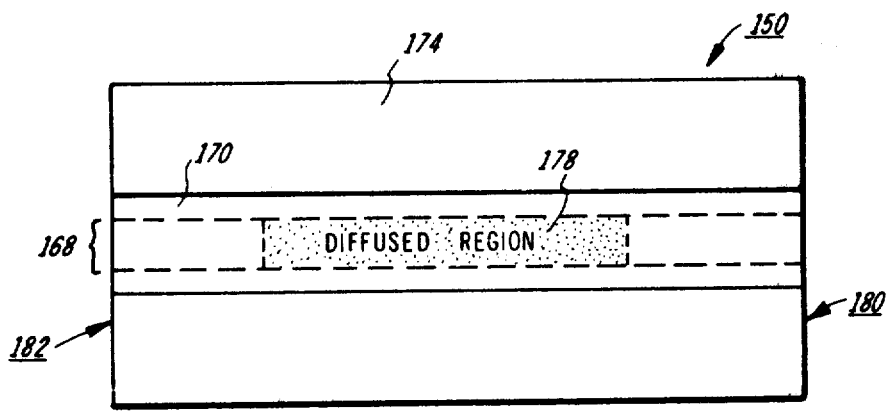
FIG. 18 is a plan view of the laser shown in FIG. 16.

In FIGS. 16–18, laser 150 comprises a substrate 152, cladding strip 154, active strip 156, cladding strip 158, second cladding strip 160 and contact strip 162. Strips 154–162 are initially formed as epitaxial layers via either LPE, MBE or MO-CVD. For example, a layer of n-$Ga_{1-x}Al_xAs$ inclusive of strip 154 is deposited on a n-GaAs substrate 152. This is followed by the deposition of the n-$Ga_{1-y}Al_yAs$ layer inclusive of strip 156 and the n-$Ga_{1-m}Al_mAs$ layer inclusive of strip 158.

Next, p-doped layers of $Ga_{1-m}Al_mAs$ and GaAs inclusive of, respectively, strips 160 and 162 are epitaxially deposited on the previously deposited n-doped layers.

After these layer depositions, a p-type preferential diffusion is performed across the structure as identified by dotted lines 164 down through the active layer of p-G $a_{-y}Al_yAs$. This diffusion renders the regions 156' and 158' 9 diffused p-type, and forms a p-n junction at 166. Thus, the p-n junction originally formed between the layers inclusive of strips 158' and 160' is moved down into or through the active layer, forming a p-n junction 166. Junction 166 has a lower bandgap than the bandgap of the original p-n junction formed between these two $Ga_{1-m}Al_mAs$ layers.

Next, a side preferential etch into substrate 152 is performed, as best shown in FIG. 17. This forms the central mesa 168 from facet to facet comprising strips 154–162. A second stage epitaxial growth, with the mesa top surface masked, comprises Ge doped GaAlAs regions 169 for providing current confinement to mesa 168. The current confinement to mesa 168 is formed in a conventional manner by the contract stripe 170 comprising the oxide stripes 172 and metalization 174. The bottom contact is provided by metalization 176.

The mesa 168, comprising strips 154–162, also includes the central p-type diffusion, bulk region 178, which consists of strip regions 156'-162'. In this aspect, the bulk region 178 of laser 150 differs from the diffusion region 76 of laser 80 in that region 178 forms the mesa structure 168 while region 96 is a region in multiple deposited layers.

The higher bandgap p-n junctions remaining between strips 158" and 160" of strips 158 and 160 will be effective to block the passage of current through these regions and, hence, substantially eliminate the flow of any current near the end facets 180 and 182. Carrier recombination occurs at junction 166 at current thresholds well below any possible turn-on threshold of the higher bandgap junctions between strips 158" and 160".

Laser 150 takes on the attributes of laser 120 in having end strip regions 156" in the active strip 156 of opposite conductivity type from active strip region 156'. Upon forward biasing of laser 150, carrier recombination will occur in region 156' while n-type regions 156" will be unpumped. These strip regions 156" function as passive waveguide strips which carry the propagating radiation to the end facets 180 and 182 for feedback and emission from the facets. Again, the beam waist will occur only at the facets 180 and 182 and provide the attributes of fundamental mode control, substantial astigmatism elimination and lower operational thresholds.

Other semiconducting crystalline materials, such as those containing In, Ga, Al, As, P, Sb, Sn and Te or other light emitting materials may be employed rather than GaAs/GaAlAs. Also, other means of current confinement known in the art may be employed instead of those shown.

Further, the thickness and compositions disclosed are intended to be only indicative of actual values. In practice, these thicknesses and compositions may possibly be outside the suggested examples and ranges in order to optimize a particular type of behavior of the laser. For each laser design, it is necessary to calculate the necessary compositions and thicknesses to optimize a certain performance parameter.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. In a heterostructure laser comprising a plurality of contiguous semiconductor layers epitaxially deposited on a substrate, one of said layers being an active region and having a lower bandgap and higher index of refraction than at least cladding layers immediately adjacent to the active region to permit carrier recombination and support radiation propagation between transverse end facets of the laser under lasing conditions, means incorporated on and/or in said laser to confine current to a portion of said active region, means in said active region to optically confine radiation propagating therein in both dimensions transverse to the direction of propagation, the extremities of said active region means falling short of said end facets, passive waveguide means extending from said end facets and optically coupled to said active region means to receive at least a portion of said propagating radiation, said passive waveguide means optically confining radiation propagating therein in both dimensions transverse to the direction of propagation, said passive waveguide means is an elongated strip contiguous to a surface of said active region means, said passive waveguide strip being of full extent between said end facets with the ends of said active region means being taper coupled to said passive waveguide strip.

2. In the heterostructure laser of claim 1, a barrier strip of very thin cross-sectional thickness formed between said active region means and passive waveguide strip, the minimum thickness of said barrier strip being sufficient to confine injected carriers to the active region means but permitting extension of the radiation propagation into said passive waveguide strip.

3. In the heterostructure laser of claim 1, a second passive waveguide strip contiguous to the surface of said active region means on the side thereof remote to the first passive waveguide strip.

4. In a heterostructure laser comprising a plurality of contiguous semiconductor layers epitaxially deposited on a substrate, one of said layers being an active layer with an active region and having a lower bandgap and higher index of refraction than at least cladding layers immediately adjacent to the active region to permit carrier recombination and support radiation propagation between transverse end facets of the laser under lasing conditions, means incorporated on and/or in said laser to confine current to a portion of said active region, means in said active region to optically confine radiation propagating therein in both dimensions transverse to the direction of propagation, the extremities of said active region means falling short of said end facets, passive waveguide means extending from said end facets and optically coupled to said active region means to receive at least a portion of said propagating radiation, said passive waveguide means optically confining radiation propagating therein in both dimensions transverse to the direction of propagation, said active region comprising a centrally located preferential diffusion region through said active layer to form a junction therein, said diffusion region falling short of said end facets, a nonplanar passive waveguide layer contiguous with said active region on the surface thereof remote from said diffusion region, said waveguide layer having an elongated thick region aligned with said diffusion region extending between said end facets, said passive waveguide means comprising the combination of said passive waveguide layer thick region and the undiffused regions of said active region.

5. In a heterostructure laser comprising a plurality of contiguous semiconductor layers epitaxially deposited on a substrate, one of said layers including an active layer having an active region and having a lower bandgap and higher index of refraction than at least cladding layers immediately adjacent to the active region to permit carrier recombination and support radiation propagation between transverse end facets of the laser under lasing conditions, means incorporated on and/or in said laser to confine current to a portion of said active region, means in said active region to optically confine radiation propagating therein in both dimensions transverse to the direction of propagation, passive waveguide means extending from said end facets and optically coupled to said active region means to receive at least a portion of said propagating radiation, means associated with said substrate to cause lateral waveguidance of said propagating radiation, said active region comprising a centrally located preferential diffusion region extending into said active layer such that radiation generated in said active region is not absorbed by the undiffused portions of said active layer, said passive waveguide means including said undiffused active layer portions.

6. In the heterostructure laser of claim 5 wherein said associated substate means comprises a channel in the surface of said substrate.

7. In the heterostructure of claim 5 wherein said passive waveguide means further includes a passive waveguide layer between said active layer and one of said cladding layers.

8. In the heterostructure of claim 7 wherein said passive waveguide layer is nonplanar.

* * * * *